Dec. 13, 1960

J. S. FOLTYN 2,964,621

COMBINED TRANSISTOR HEAT SINK AND PANEL

Filed Feb. 4, 1957

INVENTOR.
John S. Foltyn,
BY
Mueller & Aichele
Atty's.

2,964,621

COMBINED TRANSISTOR HEAT SINK AND PANEL

John S. Foltyn, Chicago, Ill., assignor to Motorola, Inc., Chicago, Ill., a corporation of Illinois Filed Feb. 4, 1957, Ser. No. 638,029

2 Claims. (Cl. 250—16)

This invention relates to a heat sink for a semiconductor device and more particularly to a heat sink for a power transistor used in a radio receiver for mobile equipment.

In the use of a power semiconductor device such as, for example, a power transistor, heat dissipation is a substantial problem inasmuch as the characteristics of the device vary undesirably with excessive rise in operating temperature. In the case of a power transistor, most of the power is dissipated through the collector junction, and consequently most of the heat to be removed is at the collector electrode. The transistor header structure radiates some heat so that it is desirable to mount the transistor exteriorly of the radio chassis. The transistor has been mounted on a separate heat sink fixed to the radio chassis. However, in this case the heat sink forms an additional element. The transistor, when mounted on the exterior of the chassis, is exposed to possible mechanical damage so that protection must be required.

An object of the invention is to provide a new and improved heat sink for a semiconductor device.

Another object of the invention is to provide a combined mounting plate and transistor heat sink for an electronic device.

A further object of the invention is to provide a heat-dissipating structure for a semiconductor device having a minimum number of elements.

Yet another object of the invention is to provide a mobile radio receiver having a combined power transistor heat sink and front panel which effectively cools the transistor mounted thereon as well as mechanically protects the same.

A feature of the invention is the provision of a thick panel forming a part of the housing of electronic apparatus which serves to mount a semiconductor device used in the apparatus in thermoconductive relationship therewith and to radiate heat acquired from the device into the atmosphere.

Another feature of the invention is the provision of a thick front panel of a radio receiver formed of heat-conductive and electroconductive metal and having holes therein through which control elements of the radio may project and on the face of which the dial of the radio may be mounted, with the panel also having a recessed portion with a flat bottom surface on which a power transistor of the receiver is mounted in heat-conductive relationship therewith.

A further feature of the invention is the provision of a mounting panel of an automobile radio receiver having substantial means and having a recess formed on one face thereof with a flat bottom in which a power transistor of the receiver is mounted in a thermoconductive relationship with the panel and in a position in which the encapsulating structure of the transistor is exposed to the atmosphere so that it may directly radiate heat as well as through the panel, but in which the transistor structure is protected mechanically.

Referring now to the drawings.

Figures 1, 2, 3:
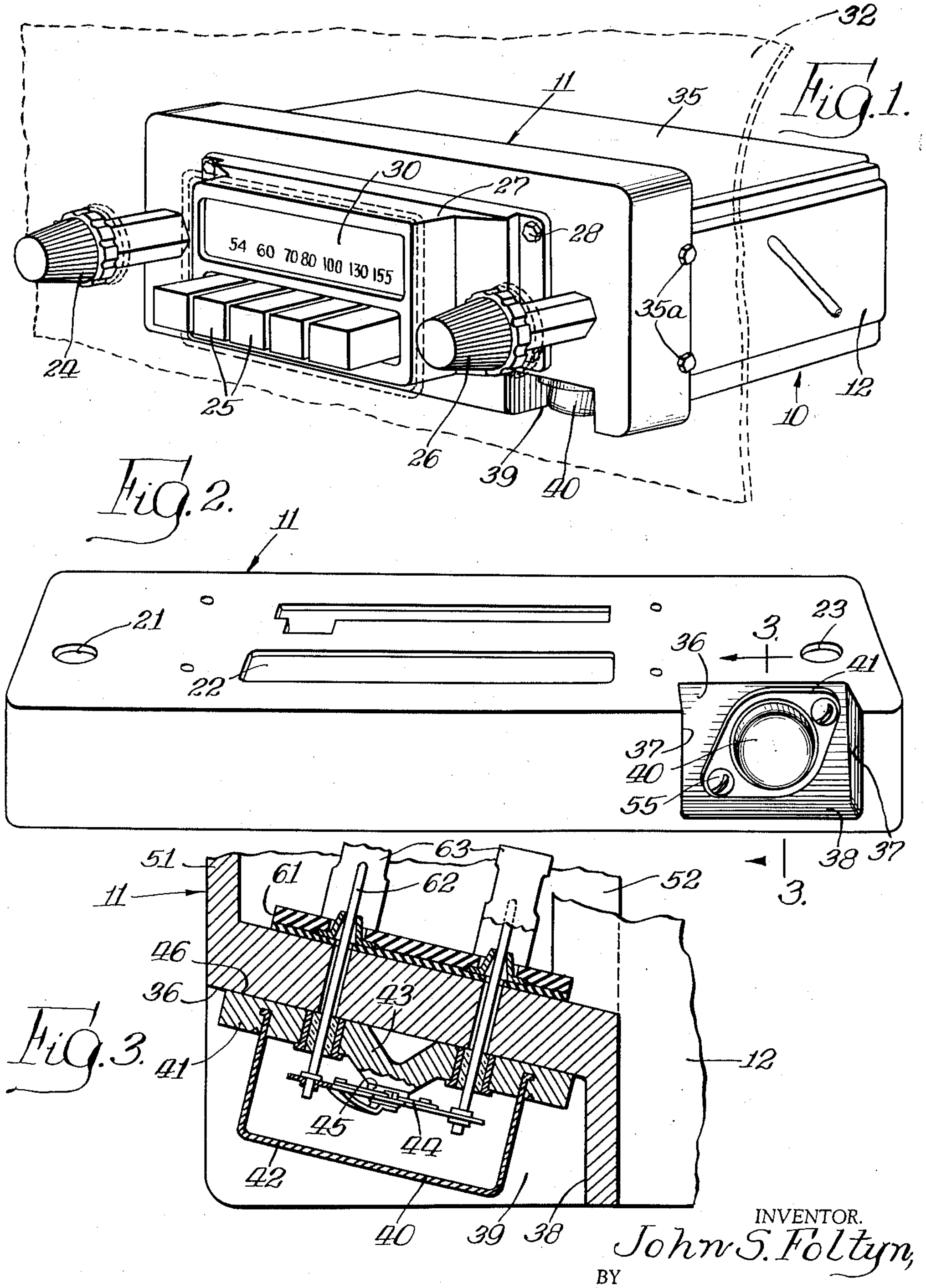
Fig. 1 is a perspective view of a combined heat sink and panel for an automobile radio receiver forming one embodiment of the invention.
Fig. 2 is a perspective view of the combined heat sink and panel.
Fig. 3 is an enlarged vertical section taken along line 3—3 of Fig. 2.

The invention provides a heavy cup-shaped front mounting plate or panel for an automobile radio receiver which serves as a mounting for the controls and the dial and which also supports the chassis of the radio. A socket or recess is provided on the lower edge portion of the front plate having a flat smooth bottom surface, preferably polished, on which is mounted the base of a power transistor forming a portion of the radio receiver. The power transistor has a die assembly therein provided with a collector electrode mounted in thermal and electroconductive contact with the pedestal on the mounting base to transfer heat to the mounting base. The mounting base in turn, transmits the heat to the panel. The walls of the recess project about the transistor to protect the transistor from mechanical damage.

There is shown in Fig. 1 of the drawing a mobile radio receiver 10 for an automobile, or the like, designed to be mounted behind the dashboard 32 of the automobile. The receiver includes a combined front panel and heat sink 11 on which is supported an electrically grounded strap-like bracket 12 for supporting the chassis 35 of the radio receiver on which circuit components of the receiver are mounted. Top and bottom plates may be secured to the bracket 12 to provide a complete housing about the receiver. The panel 11 is dished out or cup-shaped, and is provided with openings 21, 22 and 23 for mounting a combined switch-and-volume-control knob 24, pushbuttons 25 of an automatic tuner and a manual tuner 26. The panel also serves to mount by means of cap screws 28 a dial housing 27 having a dial 30 therein. The radio receiver mounts in the dashboard 32 in a well known manner.

The panel 11 may also serve as a mounting for the push button mechanism, the tuner and other heavy parts of the receiver. A cup-shaped recess or socket 39 in the lower front corner of the panel forms a mounting for a power transistor 40, in heat-conductive and electroconductive relationship therewith. The recess has a bottom wall 36, side walls 37 and a back wall 38. The bottom wall is at an angle, preferably about 103°, relative to the front wall of the panel.

The power transistor 40 includes a thick copper mounting base 41 (Fig. 3) to which a cover 42 is fused by swaging or the like. The mounting base has a flat-topped pedestal 43 on which is mounted a die assembly 44 forming the transistor per se, with a collector electrode 45 fused to the pedestal 43 in electrical heat-conductive relationship therewith. The base 41 has a smooth-surfaced flat bottom 46 which fits against a polished surface of the wall 36 forming the bottom of the recess 39. The portions of the panel forming the walls 36, 37 and 38 are thickened so that they are strong and also rapidly conduct heat away from the mounting base 41 of the transistor. A front wall 51 and side walls 52 of the panel 11 are thinner than the walls 36, 37 and 38 but are thick enough to transfer the heat away from the wall 36 and radiate the heat away from the panel 11.

The transistor 40 is secured to the mounting wall 36 by screws 55. The recess 39 is sufficiently deep that the walls thereof project beyond all portions of the transistor and prevent accidental contact with the transistor. The side walls 37 also are spaced close to the transistor base to aid protection thereof. The recess is open at the bottom to expose the transistor to the surrounding air so that the cover and base of the transistor radiate heat imparted to them from the collector junction of the die assembly 44. This aids the panel 11 in dissipating the heat conducted thereto from the collector junction of the transistor. A terminal lead clip 61 of a known type fits on feedthrus 62 of the transistor for connecting them through terminals 63 and leads (not shown) to desired points in the radio receiver.

In one specific embodiment of the invention, the panel 11 is composed of cast aluminum and may be of a thickness of the order of .076", and is about 3" in height, about 9" wide and about 1.165" deep. The walls 36 and 37 may have a thickness of 0.18" to provide rapid conduction of the heat from the transistor.

The above-described combined panel- and heat-sink effectively cools the transistor and eliminates the necessity for a separate heat sink. The structure also protects the transistor from blows or contact during manufacture, installation and use.

What is claimed is:

1. A radio receiver for installation in an automobile having a dash with a vertically extending portion, said receiver including in combination, a chassis with electrical circuit components thereon, control means, dial means, a vertically extending front mounting panel for the radio receiver adapted to be secured to the dash of the automobile and to constitute at least the major supporting means for the radio receiver, said panel having front and back sides and openings extending therethrough, said control means being supported on said panel with portions thereof extending through openings therein, said panel including provisions for supporting thereon said dial means of the radio receiver with at least a portion of said dial means extending on said front side of said panel, means for supporting said chassis on said panel on said back side thereof, and a transistor for connection to the chassis and having a heat conducting mounting base, said panel being formed of heat conducting material and having a recessed transistor mounting portion, said transistor being mounted on said mounting portion of said panel with said mounting base in heat-exchanging relationship with said mounting portion, said panel having wall portions extending from said mounting portion a distance at least as great as the height of said transistor from said mounting portion for mechanically protecting said transistor.

2. A radio receiver for installation in an automobile having a dash with a vertically extending portion having openings therein, said receiver including in combination, a vertically extending front supporting plate for the receiver for mounting on the dash of an automobile and constituting at least the major supporting means for the receiver, said supporting plate having front and back sides, chassis means for the radio receiver with electrical circuit components thereon, said chassis means being secured to and supported by said supporting plate and extending from said back side thereof, control means for the receiver secured to said supporting plate and having portions positioned on said front side thereof for extending through the openings in the dash, dial means for the receiver secured to and extending from said front side of said supporting plate to be positioned in an opening in the automobile dash, and a power transistor connected to said chassis and having a heat conducting mounting base, said supporting plate being cast of heat conducting material and having a mounting portion with a mounting surface for receiving said transistor, said mounting portion having a greater thickness than other portions of said supporting plate, said transistor having said mounting base thereof supported on said mounting portion of said supporting plate in heat conducting relation therewith, whereby said supporting plate effectively conducts heat from said transistor, said supporting plate having portions extending from said mounting surface about said transistor a distance at least as great as the height of said transistor for mechanically protecting the same.

References Cited in the file of this patent

UNITED STATES PATENTS

| | | |
|---|---|---|
| 2,446,701 | Greene | Aug. 10, 1948 |
| 2,662,975 | Schwarz | Dec. 15, 1953 |
| 2,725,505 | Webster et al. | Nov. 29, 1955 |
| 2,806,187 | Boyer | Sept. 10, 1957 |
| 2,810,071 | Race | Oct. 15, 1957 |
| 2,863,059 | Andrews | Dec. 2, 1958 |

OTHER REFERENCES

Proceedings of the I.R.E., August 1954, "Developmental Germanium Power Transistors," pages 1247–1250.